SNAP-OFF DIODE CONTAINING RECOMBINATION IMPURITIES

Filed Dec. 17, 1962

INVENTORS.
JAMES L. BOWMAN
WILLIAM C. MYERS
ROBERT S. RICKS
BY
BUCKHORN, CHEATHAM & BLORE
ATTORNEYS.

United States Patent Office 3,337,779
Patented Aug. 22, 1967

3,337,779
SNAP-OFF DIODE CONTAINING RECOMBINATION IMPURITIES

James L. Bowman, Portland, William C. Myers, Hillsboro, and Robert S. Ricks, Beaverton, Oreg., assignors to Tektronix, Inc., Beaverton, Oreg., a corporation of Oregon Filed Dec. 17, 1962, Ser. No. 245,041
4 Claims. (Cl. 317—234)

The subject matter of the present invention relates generally to PN junction semiconductor devices and in particular to snap-off diodes which are normally forwardly biased and are reversely biased by the application of an input switching pulse to produce an extremely fast rising output voltage pulse across such diode. The voltage across the diode does not follow the voltage of the input switching pulse during the snap-off operation due to the storage of minority current carriers, which have been injected through the PN junction during the forward bias condition, so that there is a time delay between the application of the reverse bias input switching pulse and the resultant increase in voltage drop across such diode. However, after the stored charge of minority carriers has reduced sufficiently the voltage across the diode increases at an extremely fast rate to produce an output voltage pulse which has a much faster risetime than the input switching pulse, of the order of 0.2 nanosecond.

The snap-off diode pulse generator device of the present invention is extremely useful in sampling type cathode ray oscilloscopes, such as that shown in copending U.S. patent application, Ser. No. 192,806, now U.S. Patent 3,248,655 as a source of fast rising, narrow width sampling or interrogating pulses to obtain a sample of the vertical input signal to such oscilloscope. In order to obtain such a narrow sampling pulse it may be necessary to differentiate, or to otherwise modify by reflection in a delay line, the fast rising voltage pulse produced by the snap-off diode to obtain a narrow fast rising voltage spike which may be employed as such sampling pulse.

A conventional PN junction diode requires a finite switching time to change from a conducting state to a nonconducting state due to the storage of minority current carriers which are injected by the forward bias voltage and must be removed by the reverse bias voltage before the diode switches to a nonconducting state. This minority carrier storage was thought to be extremely undesirable, especially by those interested in high frequency switching circuits such as are employed in computers and the like, since the storage time limits the frequency of response of such diodes and also the speed at which they can be reverse biased without distorting the input switching signal. However, it has recently been discovered that the minority carrier storage characteristics of PN junction diodes previously considered undesirable, can be used advantageously to produce fast rising voltage pulses. The snap-off diode of the present invention is so constructed and has an advantage over conventional snap-off diodes in that it has a shorter "turn-off" time during which it changes from a conducting to a nonconducting state which results in a faster rise time for the output voltage pulse produced thereby. Also, the present diode has a shorter storage time thereby allowing the generation of output pulses at a higher frequency. In addition, one embodiment of the snap-off diode of the present invention has a higher ratio of storage time to turn-off time than conventional diodes so that greater amplitude output voltage pulses having faster rise times can be produced.

Briefly, one embodiment of the snap-off diode of the present invention includes a body of single crystalline silicon semiconductor material containing donor and acceptor impurities which form a PN junction in such body. A quantity of gold is diffused into the silicon body on both sides of the PN junction so that the concentration of the gold is graduated and decreases with distance as the junction is approached. The gold functions as a recombination impurity to reduce the lifetime of the current carriers in the body by introducing recombination traps which have energy levels between the donor and acceptor energy levels of the doped silicon of such body. Since there is a smaller concentration of the gold recombination impurity near the PN junction, more of the total minority carrier storage charge of such diode is present near such junction when it is changed from a forward bias to a reverse bias condition. This decreases the time required to sweep the minority carrier charge back to the junction and increases the ratio of the storage time to the turn-off time of such snap-off diode because of the more sharply defined charge distribution. Thus, the output voltage pulse produced across such diode during snap-off operation has a greater amplitude and a faster rise time.

Therefore, one object of the present invention is to provide an improved PN junction semiconductor device.

Another object of the present invention is to provide an improved PN junction diode having less storage time and less turn-off time.

A further object of the present invention is to provide an improved PN junction snap-off diode having a greater ratio of storage time to turn-off time.

Still another object of the invention is to provide an improved PN junction snap-off diode of silicon semiconductor material in which a gold recombination impurity is present within such diode on both sides of the PN junction and has a graduated concentration which increases with distance from such junction in order to reduce the lifetime of the current carriers in such diode as the distance from such junction increases.

Another object of the present invention is to provide an improved method of manufacture of a PN junction snap-off diode.

Other objects and advantages of the present invention will be apparent from the following detailed description of preferred embodiments thereof in which reference is made to the attached drawings of which:

Figure 10A:
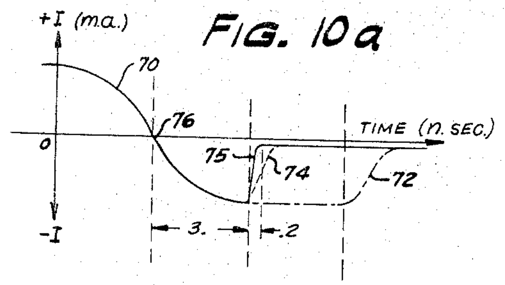
Figure 9A:
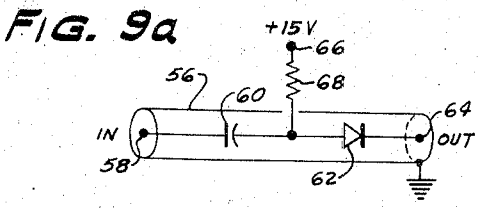
Figure 9B:
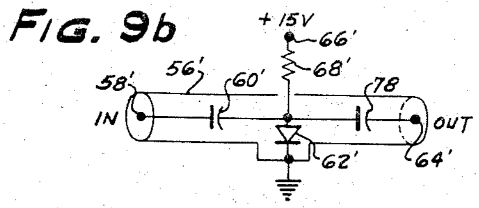
Figure 10B:
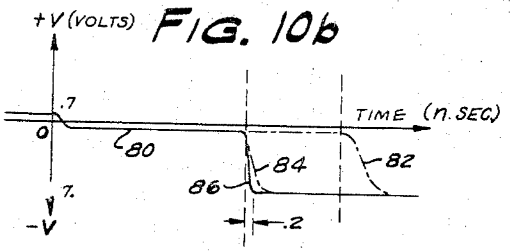

FIGS. 9*a* and 9*b* are schematic diagrams of electrical circuits employed for measuring the current and voltage characteristics, respectively, of a conventional diode and the snap-off diodes of the present invention; and FIGS. 10*a* and 10*b* shows the current and voltage waveforms, respectively, obtained at the output terminals of the electrical circuits of FIGS. 9*a* and 9*b*, respectively.

Figure 8:
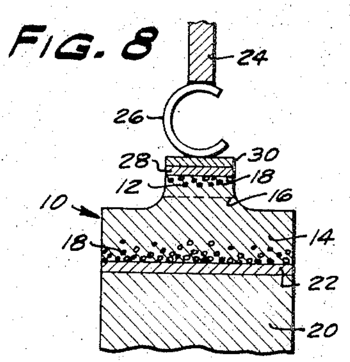
FIG. 8 is a diagrammatic sectional view of a snap-off diode formed by one embodiment of the method of the present invention.

The embodiment of the snap-off diode of the present invention shown in FIG. 8 includes a body 10 of impurity doped silicon semiconductor material containing a region 12 having predominantly N-type or donor impurities and a region 14 having predominantly P-type or acceptor impurities which form a PN junction 16 between such regions. In addition to conventional donor and acceptor impurities, the semiconductor body 10 also contains a small quantity of gold indicated by the dotted portions 18 diffused into such body on both sides of the PN junction 16. The gold atoms are preferably diffused so that they have a graduated concentration as also indicated in FIG. 8 which decreases with distance as the PN junction is approached from each side thereof, although certain of the advantages are realized even when the gold has a uniform concentration throughout the semiconductor body. The gold atoms function primarily as recombination impurities in the semiconductor body 10 since they allow the free electrons and holes in such body to recombine thereby shortening the lifetime of these current carriers. The introduction of the gold recombination impurity 18 into the silicon semiconductor body 10 provides additional trapping energy levels in the gap between the valance band and conduction band of the silicon and also between the donor energy level and the acceptor energy level of the N type and P type impurities. These additional energy levels function as recombination traps in that they allow the electrons and holes to recombine after a change in energy which is smaller than that normally required, and thereby lower the lifetime of the current carriers. Since there is a greater concentration of gold in regions more remote from the PN junction 16, the average lifetime of the carriers in these regions is reduced by a greater amount than that of the carriers located closer to such junction. In other words, more of the minority carrier storage charge previously referred to, is located closer to the junction 16 during snap-off operation. It should be noted that minority carrier storage is necessary for snap-off pulse generation and a change in the shape of the charge distribution is the thing accomplished by the technique of the present invention rather than the complete elimination of minority carrier storage.

The snap-off diode of FIG. 8 includes a metal lead member 20 which is soldered to the semiconductor body 10 after such body is plated with a layer of nickel and a layer of gold to form an ohmic connection to the P type region 14 of such body by an alloyed layer 22 of gold, nickel, tin and lead. The N type region 12 of the semiconductor body 10 is "mesa" etched in a conventional manner so that it is of an extremely small area making it very difficult to provide an ohmic connection by alloying. Instead, a metal lead wire 24 is attached to one end of a C-shaped platinum spring 26 by spot welding or the like and the other end of such spring is resiliently urged against the semiconductor body 10 to make an electrical connection to the N type region 18. This platinum spring 26 may be of any suitable shape such as an S-shape instead of the C-shape shown. The outer surface of the N type region 12 of the semiconductor body 10 is provided with a layer of nickel 28 covered by a layer of gold 30 by the plating steps previously referred to in order to form a good ohmic connection with such N type region. Thus when the snap-off diode of FIG. 8 is encapsuled the platinum spring 26 is urged against the gold coating 30 until the spring is deformed by the required amount to produce a good mechanical connection which resists failure due to heat or mechanical vibration. It is to be noted that a thermocompression bond could be employed to attach the lead wire 24 directly to the N type region 12. However, such a bond is not as effective as the structure shown because of the high inductance present in such a bonded contact due to the small diameter lead wire required. It is obvious that the N type region 12 and the P type region 14 may be reversed so that the spring connection is made to the P type region 14 and the alloy connection 22 is made to the N type region 12.

Figure 1:
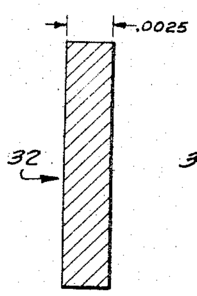
FIGS. 1, 2, 3, 4, 5, 6 and 7 are diagrammatic views showing different steps in the method of manufacture of one embodiment of the snap-off diode of the present invention.
Figure 2:
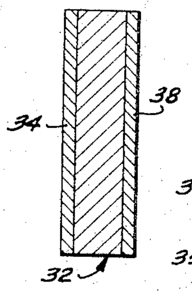
Figure 3:
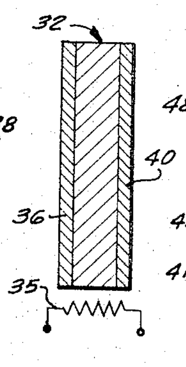

The method of manufacture of the snap-off diode of FIG. 8 is illustrated in FIGS. 1 to 7. Thus the method may start with a wafer 32 of P-type silicon having a resistivity of about .5 ohm per centimeter, shown in FIG. 1. This silicon wafer 32 may be cut from a larger piece by a diamond edged saw and cleaned by mechanical lapping and chemical etching to provide a piece which is .0025 inch thick and approximately ¾ of an inch in diameter. The wafer 32 is then coated with a boron solution 34 to provide an acceptor impurity on one surface of such wafer. This boron solution may contain boric acid ($H_3BO_3$) plus the solvent Cellosolve (ethylene glycol monomethyl ether whose formula is $HO \cdot CH_2 \cdot CH_2 \cdot O \cdot CH_3$) and alumina ($Al_2O_3$) which serves as a carrier. The boron solution 34 may be spray painted on one side of the wafer and then dried on a hot plate 35 at from 400 to 500 degrees F. for a sufficient time to evaporate the solvent and to produce the boron layer 36 containing alumina as shown in FIGS. 2 and 3. Then a phosphorous solution 38 is spray painted on the other side of the wafter 32 in a similar manner to the boron solution or it may be applied by means of a brush. The phosphorous solution may contain phosphorous pentoxide ($P_2O_5$) plus the solvent Methyl Cellosolve previously referred to. After the phosphorous solution 38 is applied to the silicon wafer 32 it is dried on the hot plate 35 in a similar manner to the boron solution to evaporate the solvent and to provide a solid phosphorous layer 40, as shown in FIGS. 2 and 3.

Figure 4:
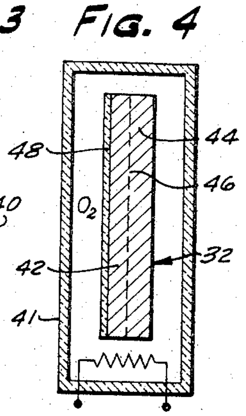
Figure 5:
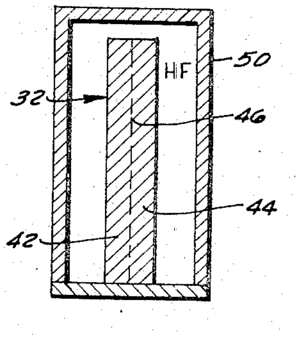
Figure 6:
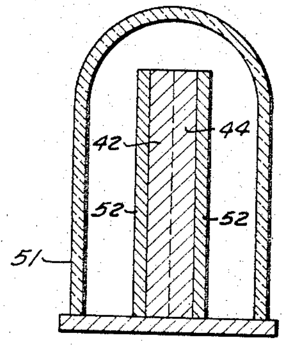
Figure 7:
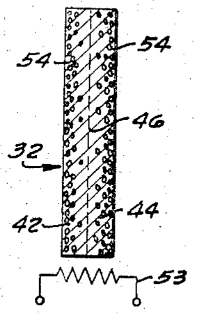

Next the coated wafer 32 of FIG. 3 is heated in a conventional furnace 41 to a temperature of 1270° centigrade for about four hours in oxygen gas ($O_2$) at atmospheric pressure, as shown in FIG. 4, to diffuse the boron and phosphorous of layers 36 and 40, respectively, into the semiconductor body 32. This produces a P type region 42 more highly doped with acceptor impurities than the original P-type silicon wafer of FIG. 1 and an N type region 44 in the semiconductor body 32 which form a PN junction 46. The phosphorous donor impurity and the boron acceptor impurity may be diffused into the silicon wafer so that they have a graduated concentration which decreases with distance from the outside of the wafer 32 towards the PN junction 46. After the diffusion step of FIG. 4 is complete a layer 48 of aluminum oxide remains over the P type region 42. This alumina layer may be removed by soaking the semiconductor body 32 in hydrogen fluoride (HF) gas for approximately 15 minutes in any convenient manner such as by enclosing the semiconductor wafer within a steel cylinder 50, as shown in FIG. 5. After the alumina layer 48 has been removed, a coating of gold 52 is applied to both sides of the semiconductor wafer 32 by placing such wafer within a bell jar 51 and evaporating the gold onto the wafer in a conventional manner in a vacuum until the coating reaches a thickness of about 2,000 Angstroms, as shown in FIG. 6. Then the gold diffusion step of FIG. 7 is preformed by heating the gold coated semiconductor wafer 32 with any suitable heater 53 for one minute at about 1,025° centigrade in the air at atmospheric pressure. This produces a graduated concentration of gold 54 within the semiconductor body 32 which is greatest in portions of the P type region 42 and the N type region 46 that are nearest the surface of the semiconductor wafer and farthest away from the PN junction region 46. Thus the concentration of the gold atoms 54 decreases with distance as the PN junction is approached. However, it is also possible to make the snap-off diode of the present invention with a uniform concentration of gold by uniformly diffusing the gold impurity atoms 54 throughout the semiconductor wafers 32. Such a uniform diffusion may be obtained by heating such wafer for a longer period of time, for example approximately 30 minutes.

Other steps necessary in the production of the snap-off diode of FIG. 8 which are not illustrated include a cleaning step after the gold diffusion step of FIG. 7, such cleaning step being the conventional one for the plating steps which follow. After cleaning the semiconductor wafer 32 is first plated with nickel and then with gold by conventional electroplating techniques. Next a conventional mesa etching process is performed to remove selected areas of layers 12, 28 and 30 to obtain the mesa-like structure of FIG. 8. The mesa etched semiconductor wafer is then diced or cut into a polarity of extremely small pieces having similar electrical characteristics. Finally the electrical leads 20 are soldered to the pieces and the diode is incapsulated in a glass envelope after the spring contact 26 is positioned correctly.

A current measuring circuit for the snap-off diode of the present invention is shown in FIG. 9*a* and includes a coaxial cable 56 having a characteristic impedance of about 50 ohms having its input terminal 58 connected through a blocking capacitor 60 to the anode of the snap-off diode 62 whose cathode is connected to an output terminal 64 of the cable. The output terminal 64 of the inner conductor of the coaxial cable 56 may be connected to the vertical input terminal of a cathode ray oscilloscope which is used to display the current characteristics of the snap-off diode. A source of biasing current 66 is connected to the anode of the snap-off diode 62 through a bias resistor 68 to forward bias such diode with a current of approximately 50 milliamperes. The lead wire from the bias resistor 68 is inserted through an opening in the outer conductor of the coaxial cable and connected to the inner conductor of such cable between the blocking capacitor and snap-off diode. The outer conductor of the coaxial cable is grounded to isolate the inner conductor from stray electrical fields. While the value of the bias resistor 68 and blocking capacitor 60 are not critical such resistor may be about three hundred ohms while the capacitor may be in the neighborhood of a few picofarads. The function of the blocking capacitor is to prevent the D.C. forward bias current from being seen by the source of input switching pulses (not shown) connected to input terminal 58, while the main purpose of the biasing resistor 68 is to decouple or isolate the current source 66 from the rest of the circuit.

When a fast rising negative stairstep voltage is applied as the input switching pulse to the input terminal 58, the current waveform 70 seen at output terminal 64 by the oscilloscope is that shown in FIG. 10*a*. Typically the input switching pulse is obtained from the mercury pulser and has a rise time of about 2.0 nanoseconds. This input switching pulse is applied at time zero and the current characteristic curve 70 of FIG. 10*a* results. If a conventional diode is employed for the snap-off diode 64, the trailing portion of the current curve 70 takes the shape shown by the dotted line 72. When a recombination impurity, such as gold, is uniformly diffused through the silicon semiconductor diode in the manner of one embodiment of the present invention, the trailing portion of the current curve 70 of such diode is that shown by the dotted line 74. If the recombination impurity is diffused so that it has the graduated concentration previously described with reference to preferred embodiment of FIG. 8, the current curve of such diode has a trailing portion indicated by the solid line 75. "Storage time" is defined as the time from the zero current cross-over point 76 to the point on the current curve 70 corresponding to the maximum negative current of the particular diode curve under consideration. "Turn-off" time is defined as the time required for the current curve 70 to fall from 90% to 10% its maximum negative current value. Thus the current characteristic curve 70–74 for the uniform gold concentration diode shows that it has less storage time and a faster turn off time than that of the normal diode. However, the ratio of storage time to turn-off time in both instances is nearly the same at approximately 8 to 1. It should be noted that the shape of the current curve 70 changes with the rise time of the input switching pulse, but that the area of such curve below the time axis remains constant for the same forward bias current.

When the graduated gold concentration diffusion technique is employed a considerably faster turn-off time is realized than that for the uniform gold concentration diode with substantially the same storage time. The actual storage time for the diode of FIG. 8 is typically 3.0 nanoseconds while its turn-off time is about 0.2 nanosecond. Thus the ratio of storage time to turn-off time for the graduated concentration gold diffusion snap-off diode is about 15 to 1. One reason for this improved turn-off time is thought to be due to the fact that more of the minority carrier charge is stored closer to the PN junction due to the graduated concentration of gold than is stored near the junction when a uniform concentration of gold is employed. In other words, there is a more abrupt change from a highly charged condition to a slightly charged condition in the graduated gold diode as you go outward from the junction. This more sharply defined charge distribution is caused by the fact that the gold recombination impurity in the graduated gold diode reduces the lifetime of the current carriers more in regions remote from the PN junction than it does in regions near such junction. Since the storage charge is more abruptly changed from a large to a small value by sweeping the stored minority carriers into the junction during the reverse bias condition, the result is a faster turn-off time.

A voltage characteristic measurement circuit is shown in FIG. 9*b* to be similar to the current measurement circuit of FIG. 9*a* except that the snap-off diode 62' has its cathode connected to ground at the outer conductor of the coaxial cable 56' and the output terminal 64' is connected through a blocking capacitor 78 to the anode of such snap-off diode. The additional blocking capacitor 78 prevents D.C. bias current from flowing into the vertical input of the oscilloscope connected at output terminal 64' from current source 66'. The voltage characteristic of the snap-off diode 62' displayed on such oscilloscope is shown as curve 80 in FIG. 10*b*. This voltage characteristic curve 80 shows the voltage across the snap-off diode 62' when the negative stairstep voltage input switching pulse is applied to input terminal 58' to switch such diode from its normally forward biased state to a reverse biased state. The input switching pulse has a rise time of about 2 nanoseconds and an amplitude sufficient to overcome the 50 milliampere forward bias current supplied by current source 66' and to reversely bias such diode. The initial voltage drop across the diode 62' is small, for example +0.7 volt, because such diode is forwardly biased to a low impedance condition at time zero. This voltage drop reverses in phase almost immediately, but remains small until the voltage characteristic curve 80 reaches a time corresponding to the turn-off time of the current curve 70, where the voltage curve suddenly rises to a large negative voltage which may vary from between −7 to −50 volts depending upon the circuit and the amplitude of the input signal employed.

The dotted curve portion 82 shows the voltage characteristic curve for a conventional switching diode and has a slow rise time corresponding to the fall time of current curve 72. The second voltage curve shown by the dotted line portion 84 indicates the voltage characteristic for a uniform concentration gold diffused snap-off diode and corresponds in rise time to the fall time of the current curve 74 in that it has a faster rise time than the conventional diode voltage curve 82. The turn-off portion 86 of the voltage characteristic of the graduated concentration gold diffused snap-off diode is shown as a solid line having a faster rise time than either curve 82 or curve 84 which is typically 0.2 nanosecond corresponding to the turn-off time of current curve 75. The voltage pulse shown in FIG. 10*b* may be differentiated to produce a negative voltage spike or it may be reflected from the short-circuited end of a delay line of the proper length to provide a narrow negative voltage pulse which may be employed as the sampling or interrogating pulse of a sampling type of cathode ray oscilloscope.

Other recombination impurities than gold may be used depending upon the semiconductor material used; for example, copper can be employed as a recombination impurity for germanium. If it is desired to manufacture a germanium snap-off diode, the same principles which apply to the silicon snap-off diode may be utilized to improve storage time and turn-off time of the germanium snap-off diode with obvious changes including the substitution of copper for gold as the recombination impurity.

Therefore, the details of that embodiment have not been disclosed.

It will be obvious to one having ordinary skill in the art that various changes may be made in the details of the above-described preferred embodiment of the invention without departing from the spirit of the invention. For this reason it is not intended to limit the scope of the present invention to the above detailed description and that scope should only be determined by the following claims.

What is claimed is:

1. A snap-off diode, comprising:
a body of single crystalline semiconductor material containing donor and acceptor current carrier doping impuirties which form a PN junction in said body; and
a quantity of a recombination impurity located within said body on both sides of said junction, and having a graduated concentration which decreases as said junction is approached, said recombination impurity being a material which reduces the lifetime of the current carriers in said body by introducing recombination traps which have energy levels between the donor and acceptor energy levels of the impurity doped semiconductor material of said body in order to reduce minority carrier charge storage in areas remote from said junction while maintaining a substantial amount of said charge storage adjacent said junction.

2. A pulse generator diode, comprising:
a body of single crystalline semiconductor material containing donor and acceptor current carrier doping impurities which form a PN junction in said body; and
a quantity of gold recombination impurity located within said body on both sides of said junction and having a graduated concentration which decreases as said junction is approached, said recombination impurity being a material which reduces the lifetime of the current carriers in said body by introducing recombination traps which have energy levels between the donor and acceptor energy levels of the impurity doped silicon of said body in order to reduce minority carrier charge storage in areas remote from said junction while maintaining a substantial amount of said charge storage adjacent said junction.

3. A snap-off diode semiconductor device, comprising:
a body of impurity doped silicon semiconductor material containing a PN junction; and a quantity of gold diffused into said body on both sides of said junction with a graduated concentration which decreases with distance as said junction is approached to reduce the lifetime of the current carriers in said body by a greater amount in regions remote from said junction in order to reduce minority carrier charge storage in areas remote from said junction while maintaining a substantial amount of said charge storage adjacent said junction, so that when said junction is changed from a forward biased to a reverse biased condition the storage time and the turn-off time of said diode are reduced and the ratio of storage time to turn off time is increased.

4. A snap-off diode semiconductor device, comprising:
a body of impurity doped germanium semiconductor material containing a PN junction; and
a quantity of copper diffused into said body on both sides of said junction with a graduated concentration which decreases with distance as said junction is approached to reduce the lifetime of the current carrier in said body by a greater amount in regions remote from said junction in order to reduce minority carrier charge storage in areas remote from said junction while maintaining a substantial amount of said charge storage adjacent said junction, so that when said junction is changed from a forward biased to a reverse biased condition the storage time and the turn-off time of said diode are reduced and the ratio of storage time to turn-off time is increased.

References Cited

UNITED STATES PATENTS

| | | | |
|---|---|---|---|
| 2,631,356 | 3/1953 | Sparks et al. | 29—25.3 |
| 2,680,220 | 6/1954 | Starr et al. | 317—235 |
| 2,705,767 | 4/1955 | Hall | 317—235 |
| 2,935,781 | 5/1960 | Heidenreich | 29—25.3 |
| 2,964,689 | 12/1960 | Buschert et al. | 317—235 |
| 3,056,100 | 9/1962 | Warner | 338—25 |
| 3,067,485 | 12/1962 | Ciccolella et al. | 29—25.3 |
| 3,147,152 | 9/1964 | Mendel | 148—1.5 |
| 3,152,024 | 10/1964 | Diedrich | 148—177 |
| 3,184,347 | 5/1965 | Hoerni | 148—33 |

JOHN W. HUCKERT, *Primary Examiner.*

R. SANDLER, *Assistant Examiner.*